United States Patent
Umezawa

(10) Patent No.: US 7,447,063 B2
(45) Date of Patent: Nov. 4, 2008

(54) NONVOLATILE SEMICONDUCTOR MEMORY DEVICE

(75) Inventor: Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 167 days.

(21) Appl. No.: 11/530,365

(22) Filed: Sep. 8, 2006

(65) Prior Publication Data
US 2007/0058429 A1    Mar. 15, 2007

(30) Foreign Application Priority Data
Sep. 9, 2005    (JP) ............................. 2005-263031

(51) Int. Cl.
*G11C 11/36* (2006.01)
(52) U.S. Cl. .................... 365/175; 365/189.11; 365/212
(58) Field of Classification Search ................. 365/175, 365/189.11, 212
See application file for complete search history.

(56) References Cited

U.S. PATENT DOCUMENTS
7,145,824 B2 * 12/2006 Bill et al. ..................... 365/212

OTHER PUBLICATIONS

J.D. Bude, et al., "Secondary Electron Flash—a High Performance, Low Power Flash Technology for 0.35 μm and Below", IEDM '97, 4 pages.
Masataka Kato, et al., "A Shallow-Trench-Isolation Flash Memory Technology with a Source-Bias Programming Method", IEDM '96, pp. 177-180.

* cited by examiner

*Primary Examiner*—Son Dinh
*Assistant Examiner*—Nam Nguyen
(74) *Attorney, Agent, or Firm*—Oblon, Spivak, McClelland, Maier & Neustadt, P.C.

(57) ABSTRACT

The nonvolatile semiconductor memory device according the this invention has a plurality of memory cells arranged in a matrix form and each having a floating gate; at least one first diode connected between drains of said plurality of memory cells and a ground terminal; and at least one second diode connected between sources of said plurality of memory cells and said ground terminal, wherein said first diode and said second diode have a same temperature characteristic. Said first diode and said second diode may be of parasitic diodes, Zener diodes or devices with avalanche breakdown voltages.

20 Claims, 6 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Applications No. 2005-263031, filed on Sep. 9, 2006, the entire contents of which are incorporated herein by reference.

TECHNICAL FIELD

The present invention relates to electrically reprogrammable nonvolatile semiconductor memory devices, and more specifically relates to NOR-cell type nonvolatile semiconductor memory devices.

BACKGROUND OF THE INVENTION

NOR type flash memories are typically used to store programs or codes for cellular phones. NOR type flash memory has a structure with a single memory cell connected between a bit line and a ground line. NOR type flash memories are of lower density compared with NAND type flash memories, and need further to be miniaturized in order to increase memory capacity. Recently, in response to demands for cost reduction and increasing memory capacity, still further miniaturization has been proceeded for NOR type flash memories.

NOR type flash memories adopt a method for injecting electrons into a floating gate by Channel-Hot-electrons during programming operation. In this programming method, by flowing a large current of several micro-amperes through a channel, large amounts of electrons flow from a source to a drain. The large amount of electrons flowing into the drain from the source generate electron hole pairs in the drain side depletion layer. By applying a high voltage to a control gate, a portion of the electron hole pairs obtains acceleration energy by the electrical voltage across the horizontal direction, holes move toward the substrate and a portion of the electrons obtain enough energy to become Hot-electrons to overcome an energy barrier of the gate oxide film and is injected into the floating gate. Therefore, it is necessary to apply high voltages across the source and the drain and to the control gate at the same time. In other words, Hot-electron injection will not happen if only one of either the source and the drain or the control gate is applied with a high voltage.

It turns out that a large drain current is needed for programming a cell by the Channel-Hot-electron programming operation using this physical principal. An energy greater than the energy barrier of a silicon dioxide film which is in between the floating gate and the channel should be around −4 eV in order to render Hot-electrons to be injected into the floating gate. Moreover, the potential difference between the drain and the source is typically around 5V.

At the same time, as mentioned, it is difficult to make the potential difference between the drain and the source small despite the advances in memory cell miniaturization. When the miniaturization of memory cells is advanced and the channel length is reduced, a punch-through voltage will be lowered and a leakage current will flow through unselected memory cells which are connected to a common programming bit line. As a result, it might bring fatal error operations such as it can not operate correctly.

Therefore, a method is suggested whereby a negative voltage is applied to the memory cell substrate during programming operation of a NOR type flash memory, and to reduce a voltage across drain and source to around 3V (J. D. Bude, et al., "Secondary Electron Flash—a High Performance, Low Power Flash Technology for 0.35 um and Below", IEDM, hereinafter called "Document 1").

The outline configuration of the NOR type flash memory 100 implementing the programming method described in the Document 1 is shown in FIG. 6. The NOR type flash memory 100 has a memory cell array 101. For conveniences of explanation, only 3×3 memory cells and corresponding bit lines B0-B2 and word lines W0-W2 are shown in FIG. 6. 102 is a Column Decoder, 103 is a Row Decoder, 104 is a Drain Charge Pump (DCP), 105 is a Sense Amplifier (S/A), 106 is a Negative Charge Pump (NCP) and 107 is a Source Line Decoder.

According to the programming operation of the NOR type flash memory 100 shown in FIG. 6, a larger electrical field is applied to the depletion layer of the drain side, hole-electron pairs are generated by electrons running toward the drain, and the holes are flown into the substrate by a horizontal electrical field. At the same time, electrons from the electron hole pairs flow into the drain in a vertical direction. The electrons flowing in the vertical direction obtain an energy greater than the energy barrier of a silicon oxide film and are injected into the floating gate (Masataka Kato, et al., "A Shallow-Trench-Isolation Flash Memory Technology with a Source-Bias Programming Method", IEDM' 96, hereinafter called "Document 2") This phenomenon is called secondary electron collision principle and is considered to be promising and draws attention as a method to enable shrinking of channel length L of a memory cell.

Here, assuming the drain electron current flowing between the source and the drain of the NOR type flash memory 100 of FIG. 6 is Iprg,e (Electron Current), the current flowing from the drain charge pump 104 is Idcp, the current flowing from the channel into the substrate (substrate hole current) is Iprg,h (Hole Current), and the current flowing into the negative charge pump 106 is Incp, the following relationships are met:

$$Idcp > Iprg,e \quad (1)$$

$$Incp > Iprg,h \quad (2)$$

$$Iprg,e \approx Iprg,h \quad (3)$$

However, the typical programming operation described in Document 1 has the following problem. In the programming operation method of the NOR type flash memory 100, the substrate hole currents Iprg,h which is almost equal to the drain electron currents Iprg,e flows as shown in the relationship (3) When designing a NOR type flash memory, a negative voltage needed for programming is generated from an external negative voltage supply and is provided by the negative charge pump (NCP) 106. Moreover, a drain voltage needed for programming is also generated from the external positive voltage source and provided by the drain charge pump (DCP) 104. In order to maintain stable programming operations, it is necessary to keep the currents and voltages that the memory cell requires to be constant, therefore, the negative charge pump (NCP) 106 and the drain charge pump (DCP) 104 are required to have power to supply enough voltage and current. Therefore, it is necessary to make the circuit area (Dimension) of each of the pumps larger. However, making the circuit area (Dimension) larger renders making the circuit area of the entire peripheral circuit, including the pumps, larger, thereby increasing production costs.

SUMMARY OF THE INVENTION

According to one embodiment of this invention, it is provided that a nonvolatile semiconductor memory device according the this invention has a plurality of memory cells arranged in matrix and each having a floating gate; at least one first diode connected between drains of said plurality of memory cells and a ground terminal; and at least one second diode connected between sources of said plurality of memory cells and said ground terminal, wherein said first diode and said second diode have a same temperature characteristic.

DETAILED DESCRIPTION OF THE INVENTION

Figure 1:
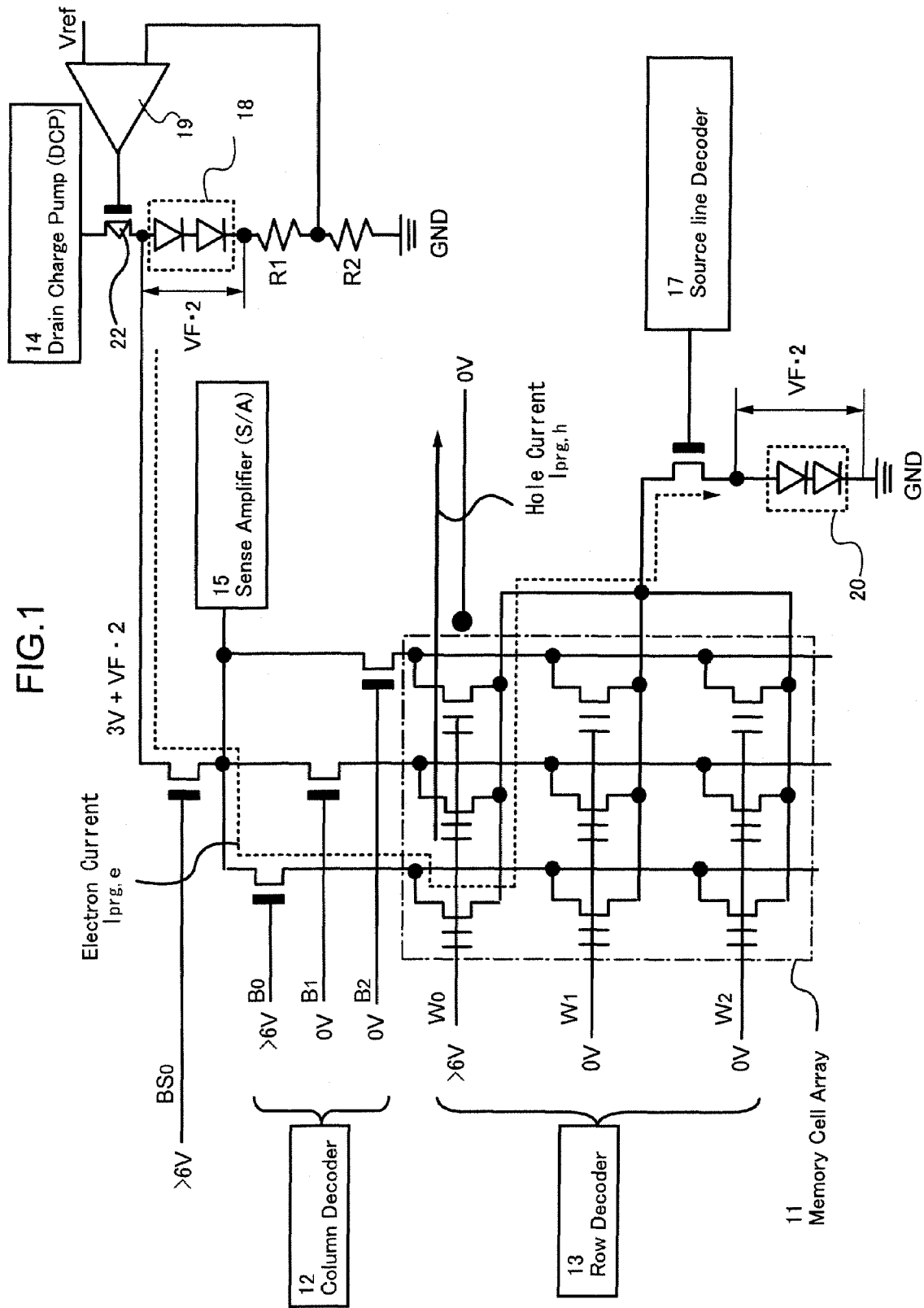
FIG. 1 is the outline block diagram of the NOR type flash memory 10 which is a nonvolatile semiconductor memory device according to the embodiment of this invention.

Hereafter, a preferred embodiment of a nonvolatile semiconductor memory device according to this invention will be explained by reference to the drawings. However, nonvolatile semiconductor memory devices of this invention are able to be implemented into a range of different aspects, and the embodiments in the descriptions presented below do not allow the invention to be interpreted narrowly. Furthermore, in the drawings which are referred to in this embodiments 1-3, the same references are used for the same portions or the portions which have similar functions. Repetition of the explanations for the references is omitted.

The NOR type flash memory 10 according to the embodiment of this invention is shown in FIG. 1. The NOR type flash memory 10 has a memory cell array 11. While in FIG. 1, only 3×3 memory cells with floating gate, and bit lines B0-B2 and word lines W0-W2 both corresponding to the memory cells are shown for the convenience of explanation, however, the NOR type flash memory 10 of this embodiment actually has a memory cell array 11 which have memory cells with floating gate arranged in a matrix form of m×n and bit lines B0-Bm-1 and word lines W0-Wn-1 both corresponding to the memory cell array 11. 12 is a Column Decoder, 13 is a Row Decoder, 14 is a Drain Charge Pump (DCP), 15 is a Sense Amplifier (S/A), 17 is a Source Line Decoder, 18 and 20 are parasitic diodes (diodes made of p-n junctions formed in wells), 19 is an operation amplifier, and 22 is a switching element (transistor). The parasitic diode 18 is connected between the drain terminal of the memory cell and the GND along with resistances R1, R1, the bit lines B0-Bm-1 and transistors controlled by a block selection line BS0. The parasitic diode 20 is connected between the source terminal and GND along with a transistor controlled by a source line decoder 17. The transistor 22 controllably provides the output of the drain charge pump 14 at the drain and the gate is input with the output signal of the operational amplifier 19.

The NOR type flash memory 10 according to this embodiment utilizes the secondary electron collision principle as same as the conventional art for programming operations. While keeping the substrate potential at 0V, adopting a source bias method and marinating the same programming characteristics to the substrate bias method, the voltages applied to the source, the gate and the drain of the selected memory cell are uniformly increased. In the NOR type flash memory 10 according to this embodiment the uniform increase in voltages by having parasitic diodes 18 and 20 in the drain and the source sides of the memory cell is realized.

In this embodiment, the parasitic diode 18 adopts the structure which has two series connected parasitic diode elements. A constant current flows through the parasitic diode 18, resistances R1 and R2. When the voltage drop by one parasitic diode element is VF, the voltage drop of VF×2 will occur at the parasitic diode 18. As a result, the drain electrical potential of the memory cell is increased by VF×2 in addition to the amounts of the voltage drop (=3V) by the resistances R1 and R2. In this embodiment, the reference voltage Vref of the operational amplifier is 1.2V and the voltage drop at the resistances R1 and R2 is 3V, the drain potential of the selected memory cell is higher than GND potential by (3V+VF×2).

In this embodiment, the parasitic diode 20 adopts the structure which has two series connected parasitic diode elements. A constant current (drain electron current Iprg,e) flows though the parasitic diode elements. When the voltage drop by one parasitic diode element is VF, the voltage drop of VF×2 will occur at the parasitic diode 20. As a result, the source potential of the memory cell is increased by VF×2 above GND potential in addition to Iprg,h≈Iprg,e.

In this embodiment, the parasitic diode 18 and the parasitic diode 20 utilize the same parasitic diode elements with the same temperature characteristics, so that it is possible to compensate the diode characteristics changes caused by temperature changes.

In this embodiment, the voltages applied to the source, the gate and the drain of the selected memory cell are greater than 6V, for example, 6.5V; however, it is not limited to that.

In the NOR type flash memory 10 according to the embodiment, by keeping the substrate potential to 0V during programming operation, a negative voltage charge pump circuit which was usually necessary in the prior art, becomes unnecessary and voltage fluctuations caused by the programming current are suppressed. By forward connecting the parasitic diode 18 consisting of parasitic diode elements to the source of the selected memory cell, a large current will flow though the source of the selected memory cell and the potential supplied to the source will stabilized.

The parasitic diode elements of the parasitic diode 18 or 19 can be easily made by using the necessary process technology for manufacturing ordinary CMOS. Therefore, it is not necessary to increase processes to manufacture the NOR type flash memory 10 of this embodiment.

The voltage levels of the gate and the drain of the selected memory cell can be adjusted by tuning each of the regulators for supplying voltages to the terminals. However, occasionally, stability can not be achieved because the changes in the temperature and the voltages do not coincide with the source voltage level. On the other hand, since the NOR type flash memory 10 according to this embodiment of this invention adopts forward biased diode elements which are parasitic diodes for each of the regulators for providing voltages to the source and the drain of the memory cell, this enables reliable compensation of changes in temperature and in voltages.

The NOR type flash memory 10 according to the embodiment of this invention does not require a negative voltage charge pump circuit which was needed in the prior art, making the peripheral circuitry area smaller. It is also able to suppress the voltage fluctuations at the substrate due to the programming current. It is also able to provide, by forward connecting the parasitic diode 18 consisting of parasitic diode elements to the source of the selected memory cell, a large current flowing though the source of the selected memory cell and a stable voltage applied to the source.

In this embodiment, the parasitic diode 18 and 20 adopted the structure that each of two parasitic diode elements are connected in series, however, it is possible to change a number of parasitic diode elements with respect to the voltage supplied to the drain and the source of the memory cell.

Figure 2:
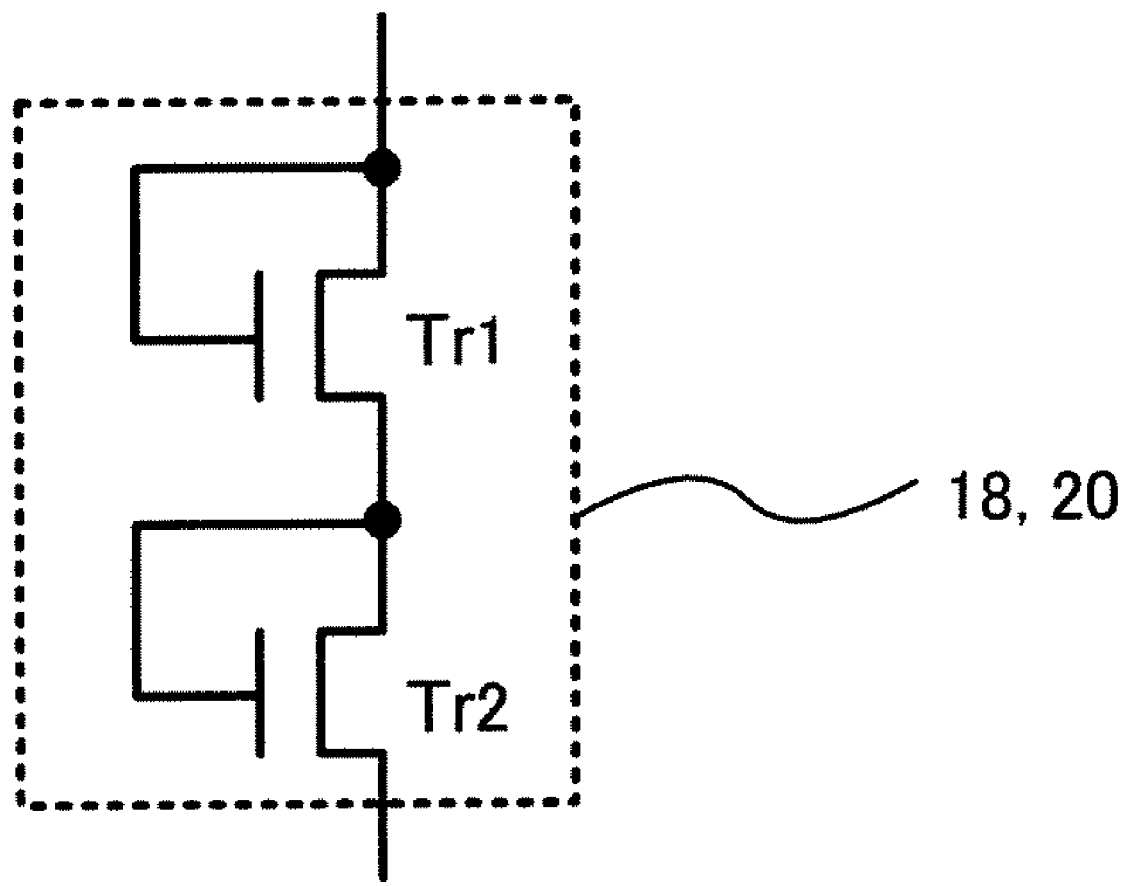
FIG. 2 is one embodiment of parasitic diode 18 or 20.

In the NOR type flash memory 10 according to the embodiment of this invention, during programming, the source voltage of the memory cell is lower than the gate voltage (>6V), therefore, the source and the drain of the memory cell can be increased by replacing them with diode connected transistors Tr1 and Tr2 as shown in FIG. 2 and by using the threshold voltages thereof. The transistors used to replace the parasitic diode 20 are preferably transistors with thin gate oxide film. On the other hand, the parasitic diode 18 at the drain side may be replaced with elements having diode connected transistors as shown in FIG. 2, however, those gate insulators are preferably thick because the junction withstanding voltages thereof should be kept. As mentioned above, according to the NOR type flash memory of one embodiment of this invention, the scaling of memory cells in NOR type flash memory are achieved and at the same time, decreases in the peripheral circuit area and suppression of substrate potential fluctuations due to programming current are achieved.

Embodiment 1

In this embodiment, the NOR type flash memory 10 according to the nonvolatile semiconductor memory device of this invention, in the case Zener diodes are used instead of the parasitic diodes 18 and 19 connected in forward bias.

Figure 3:
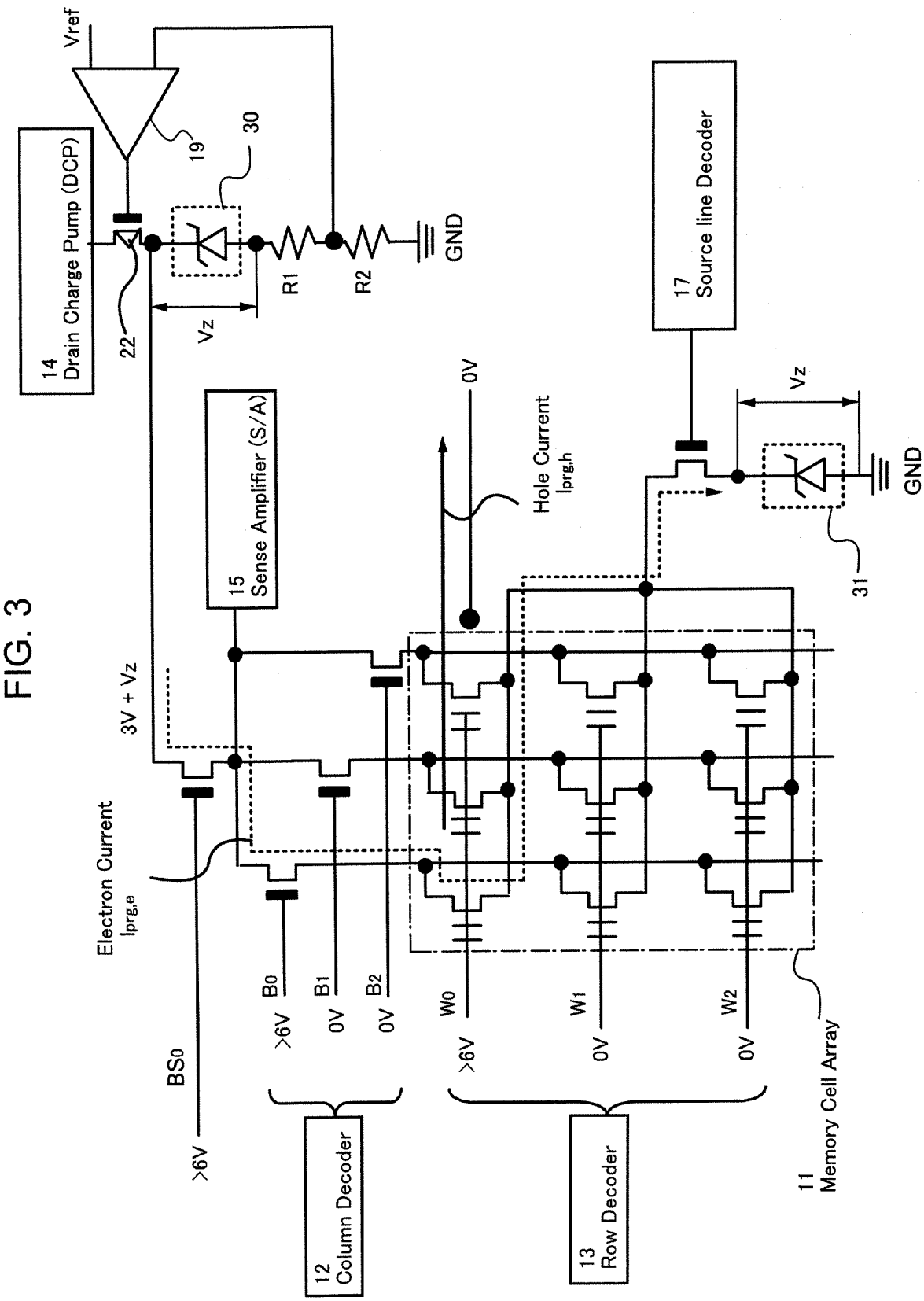
FIG. 3 is the outline block diagram of the NOR type flash memory 10 which is a nonvolatile semiconductor memory device according to the embodiment of this invention.

The NOR type flash memory 10 according to this embodiment is shown in FIG. 3. The explanations on the same structure elements as those of FIG. 1 will be omitted.

30 and 31 are Zener diodes. The Zener diode 30 is connected between the drain terminal of the memory cell and the GND along with resistances R1, R1, the bit lines B0-Bm-1, and transistors controlled by a block selection line BS0. The Zener diode 31 is connected between the source terminal and GND along with a transistor controlled by a source line decoder 17.

The NOR type flash memory 10 according to this embodiment utilizes the secondary electron collision principle as same as the conventional art for programming operations. While keeping the substrate potential at 0V, adopting a source bias method and marinating the same programming characteristics to the substrate bias method, the voltages applied to the source, the gate and the drain of the selected memory cell are uniformly increased. In the NOR type flash memory 10 according to this embodiment the uniform increase in voltages by having Zener diodes 30 and 31 in the drain and the source sides of the memory cell is realized.

In the NOR type flash memory 10 according to this embodiment, by keeping the substrate voltage to 0V during programming operations, it is able to omit a negative voltage charge pump circuit and thereby suppressing the voltage fluctuations due to the programming current.

In this embodiment, a constant current flows though the Zener diode 30 and the resistances R1 and R2 and a voltage drop of Vz occurs at the Zener diode 30. As a result, the drain potential of the memory cell is increased by Vz in addition to the voltage drop by the resistance R1 and R2 (=3V). In this embodiment, the reference voltage Vref of the operation amplifier 19 is 1.2V, and the voltage drop by the resistance R1 and R2 is 3V, which makes the drain potential of the selected memory cell is (3V+Vz) higher from GND potential.

In this embodiment, a constant current (drain electron current Iprg,e) flows through the Zener diode 31, and voltage drop Vz occurs across the zener diode 31. As a result, the source potential of the memory cell can be increased by Vz. Note, Iprg,h ≈Iprg,e.

In this embodiment, the Zener diode 30 and the Zener diode 31 have the same temperature characteristic; therefore, it compensates the changes in characteristics of the diode elements with temperature changes.

In the above mentioned forward biased parasitic diodes, voltages are usually inversely proportional to temperatures. In other words, the higher the temperature becomes, the lower the voltage across the forward biased diodes may become. At high temperature, a current necessary for programming decreases and the programming speed will decrease. A decrease in programming speed can be prevented by setting the drain voltage of the memory cell, however, it should be guaranteed not to cause a punch-through phenomenon. On the other hand, when the voltage setting range is limited and the drain voltage of the memory cell can not be set higher, the usage of Zener diodes having little characteristic changes with respect to temperature changes will prevent the decrease in source programming speed.

Embodiment 2

In this embodiment, the NOR type flash memory 10 according to the nonvolatile semiconductor memory device of this invention, in the case elements having avalanche breakdown voltage are used instead of the parasitic diodes 18 and 19 connected in forward bias.

Figure 4:
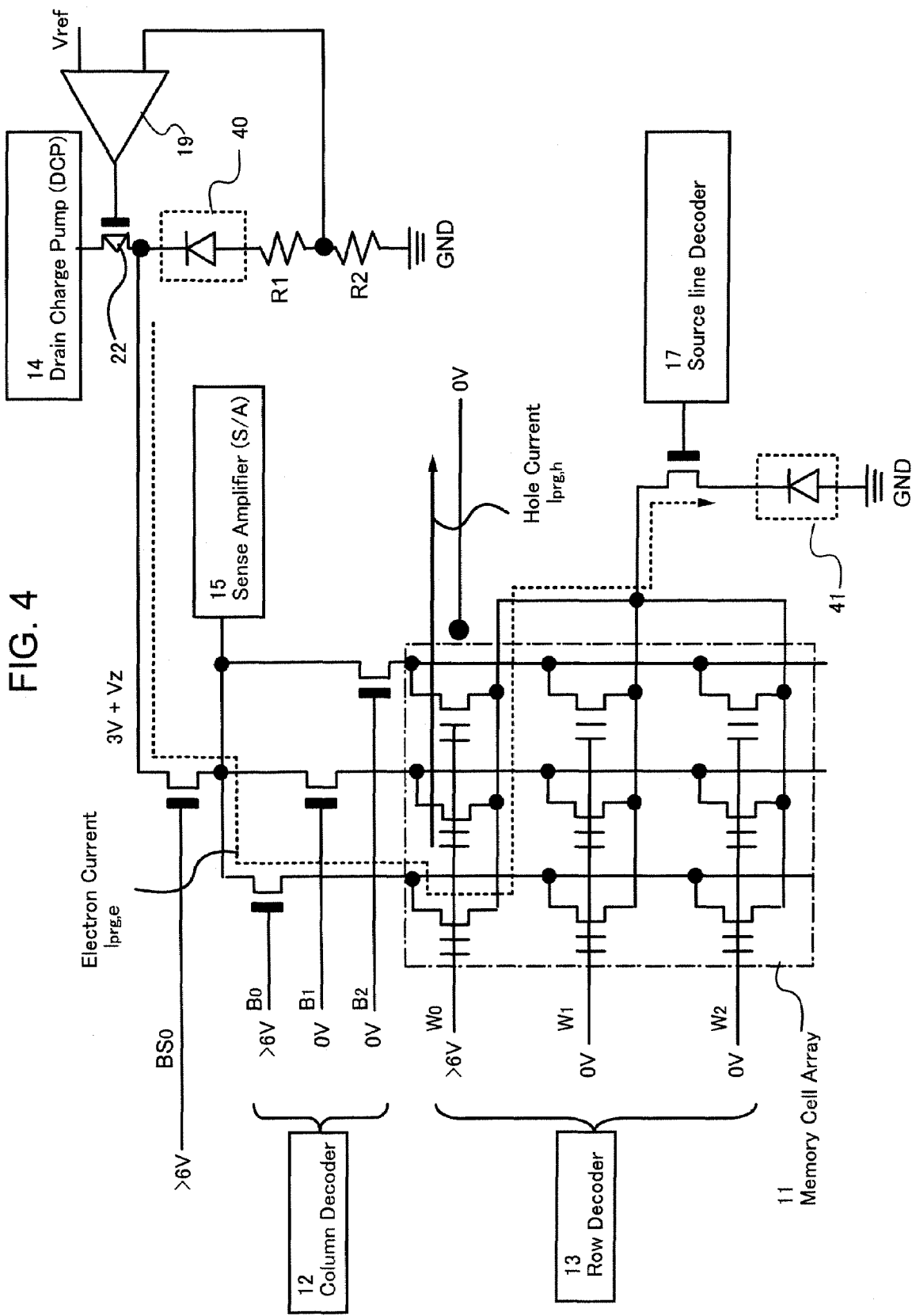
FIG. 4 is the outline block diagram of the NOR type flash memory 10 which is a nonvolatile semiconductor memory device according to the embodiment of this invention.

The NOR type flash memory 10 according to a nonvolatile semiconductor memory device of an embodiment of this invention is shown in FIG. 4. Elements which are the same as those of FIG. 1 are not explained.

In this embodiment, 40 and 41 are diodes. The diode 40 is connected between the drain terminal of the memory cell and the GND along with resistances R1, R1, the bit lines B0-Bm-1 and transistors controlled by a block selection line BS0. The diode 41 is connected between the source terminal and GND along with a transistor controlled by a source line decoder 17.

The NOR type flash memory 10 according to this embodiment utilizes the secondary electron collision principle as same as the conventional art for programming operations. While keeping the substrate potential at 0V, adopting a source bias method and marinating the same programming characteristics to the substrate bias method, the voltages applied to the source, the gate and the drain of the selected memory cell are uniformly increased. In the NOR type flash memory 10 according to this embodiment the uniform increase in voltages by having diodes 40 and 41 in the drain and the source sides of the memory cell is realized.

In the NOR type flash memory 10 according to this embodiment, by keeping the substrate voltage to 0V during programming operations, it is able to omit a negative voltage charge pump circuit and thereby suppressing the voltage fluctuations due to the programming current.

In this embodiment, a constant current flows though the diode 40 and the resistances R1 and R2 and a voltage drop of Vz occurs at the diode 40. As a result, the drain potential of the memory cell is increased by Vz in addition to the voltage drop by the resistance R1 and R2 (=3V). In this embodiment, the reference voltage Vref of the operation amplifier 19 is 1.2V and the voltage drop by the resistance R1 and R2 is 3V, which makes the drain potential of the selected memory cell (3V+Vz) higher from GND potential.

In this embodiment, a constant current (drain electron current Iprg,e) flows through the diode 41, and voltage drop Vz occurs across the diode 41. As a result, the source potential of the memory cell can be increased by Vz. Note, Iprg,h≈Iprg,e.

In this embodiment, the diode 40 and the diode 41 have the same temperature characteristic; therefore, it compensates the changes in characteristics of the diode elements with temperature changes.

In this embodiment, reverse biased diodes with avalanche breakdown voltage were used. However they could be replaced with diodes of MOS transistors.

In the above mentioned forward biased parasitic diodes of the embodiment, voltages are usually inversely proportional to temperatures. In other words, the higher the temperature becomes, the lower the voltage across the forward biased diodes may become. At high temperature programming, a voltage across the forward bias may decrease generally. At high temperature programming, the source voltage of the memory cell will decrease, making a voltage between the source and the drain high and the punch through resistive voltage may decrease. In this embodiment, devices having avalanche breakdown voltages are formed and connected to the source of memory cell during programming, increasing the punch through tolerance. The breakdown voltage of a device which has avalanche breakdown voltage increases at high temperature. A punch through tolerance is guaranteed at high temperature.

Embodiment 3

In this embodiment, the NOR type flash memory 10 according to the nonvolatile semiconductor memory device of this invention, in the case a drain voltage detection circuit is used at the drain side of the memory cell and a MOS transistor is used at the source side.

Figure 5:
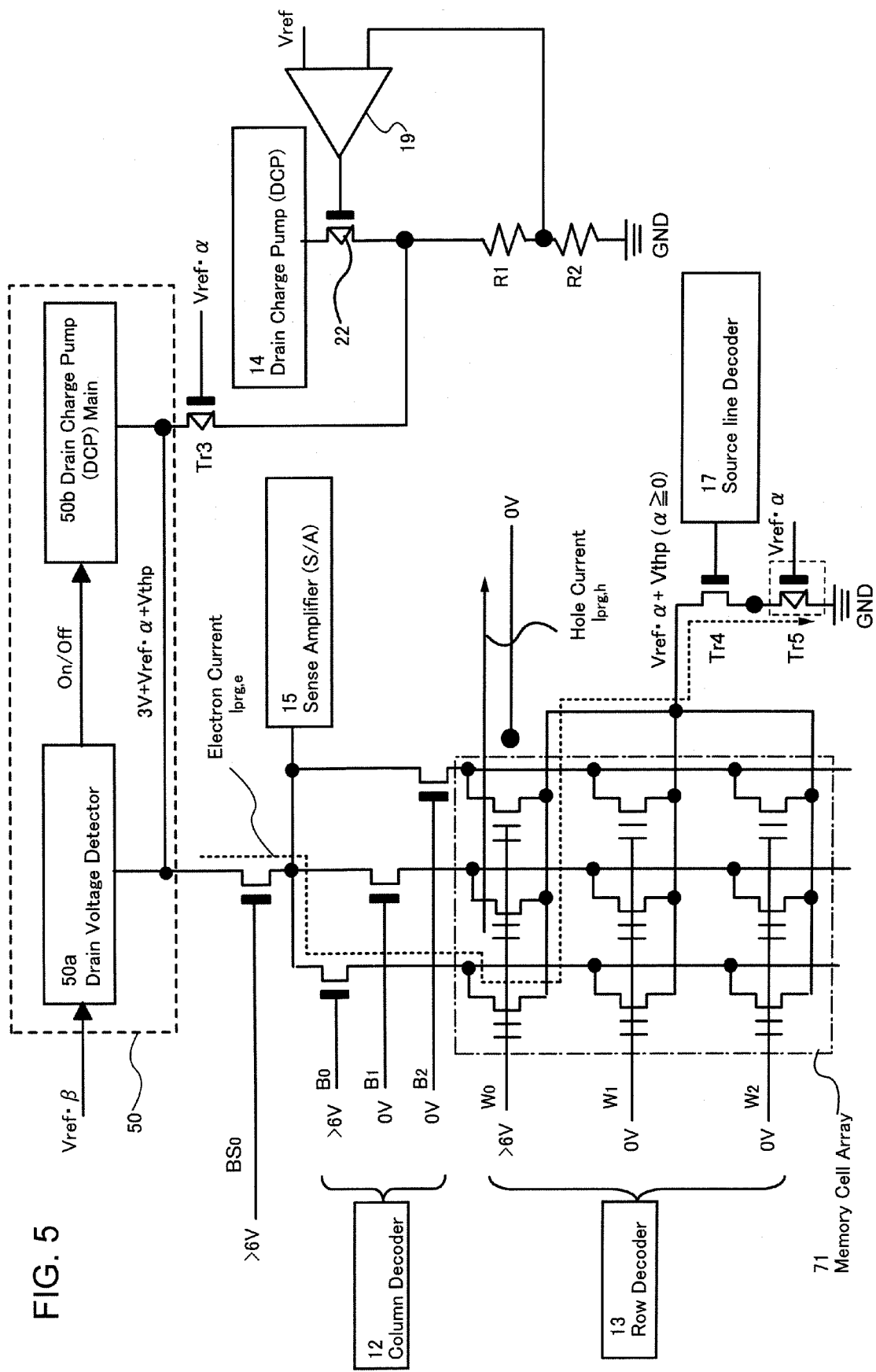
FIG. 5 is the outline block diagram of the NOR type flash memory 10 which is a nonvolatile semiconductor memory device according to the embodiment of this invention.
Figure 6:
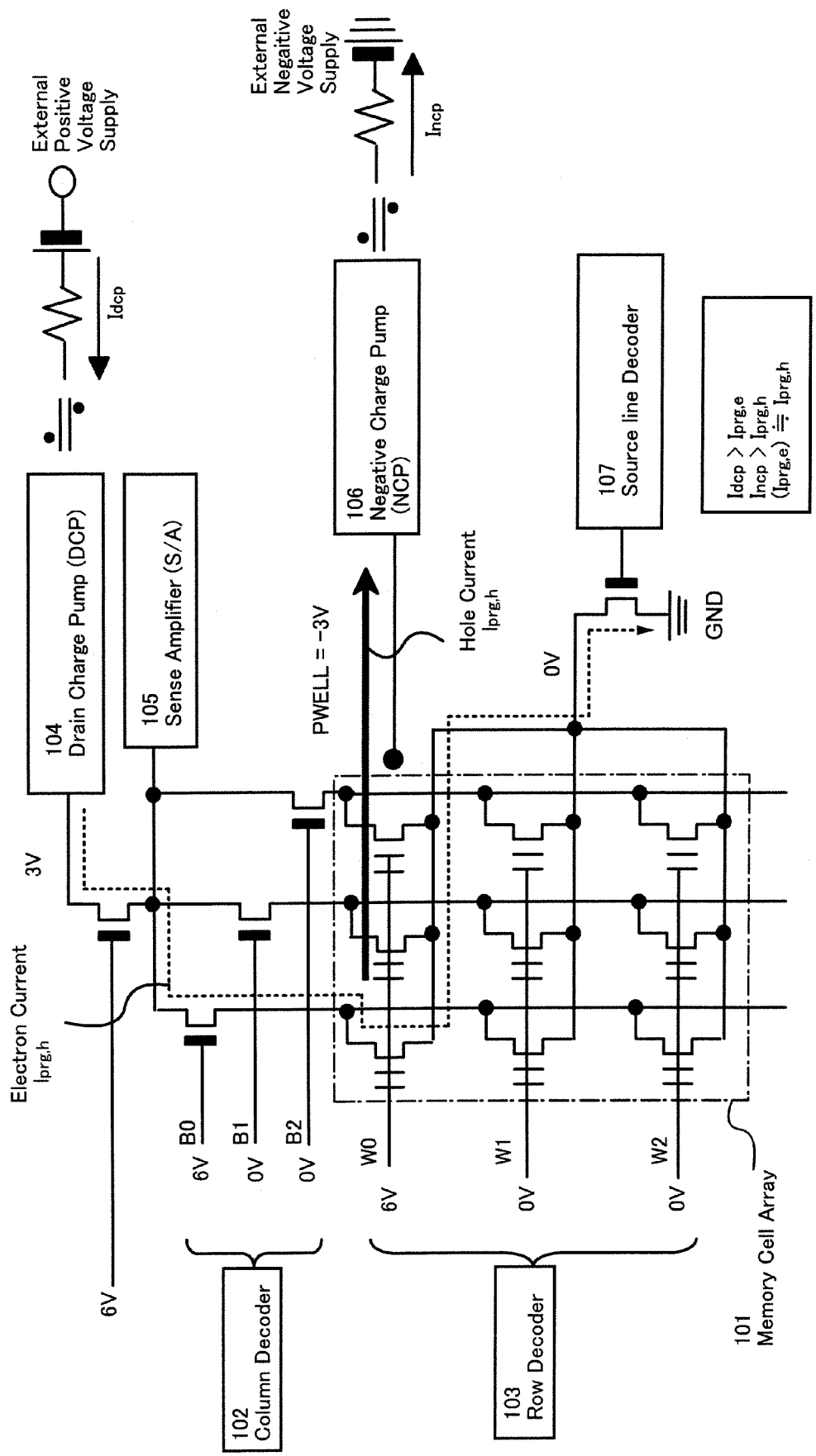
FIG. 6 is the outline block diagram of the NOR type flash memory 10 which is a nonvolatile semiconductor memory device according to the embodiment of this invention.

The NOR type flash memory 10 according to a nonvolatile semiconductor memory device of an embodiment of this invention is shown in FIG. 5. Elements which are same as those of FIG. 1 are not explained.

50 is a negative voltage feedback system and contains a drain voltage detection circuit (Drain Voltage Detector) 50a and a main drain charge pump (Drain Charge Pump (DCP) Main) 50b. One terminal of the negative voltage feedback system is connected to a P channel type transistor Tr3. The source of the memory cell is connected to the GND through an N channel type transistor Tr4 which is controlled by the source line decoder 17 (threshold voltage: Vthp) and a P channel type transistor Tr5 (Threshold Vref×α, α≧0). In the NOR type flash memory 10 according to the embodiment of this invention, the transistor Tr3 and the transistor Tr5 have the same temperature characteristic, so that they compensate characteristic changes in response to temperature changes.

In the NOR type flash memory 10 according to this embodiment, by keeping the substrate voltage to 0V during programming operations, it is able to omit a negative voltage charge pump circuit and thereby suppressing the voltage fluctuations due to the programming current.

In the NOR type flash memory 10 according to this embodiment, the drain voltage detection circuit 50a outputs a logic signal (On/Off) to activate or not to activate the main drain charge pump 50b. Specifically, it outputs an activation signal input to an oscillator circuit of the main drain charge pump 50b. When the voltage supplied to the negative feedback system 50 is Vref×β, the drain voltage detection circuit 50a compares the drain voltage of the memory cell (3V+Vref×α+Vthp) with Vref×β, operates the main drain charge pump 50b and keeps the drain voltage of the memory cell during programming stable.

I claim:

1. A nonvolatile semiconductor memory device comprising:
   a plurality of memory cells arranged in matrix and each having a floating gate;
   at least one first diode connected between drains of said plurality of memory cells and a ground terminal; and
   at least one second diode connected between sources of said plurality of memory cells and said ground terminal,
   wherein said first diode and said second diode have a same temperature characteristic.

2. The nonvolatile semiconductor memory device according to claim 1 further comprising a first resistor and a second resistor connected in series between said first diode and said ground terminal.

3. The nonvolatile semiconductor memory device according to claim 2 further comprising a charge pump connected to the drains of said memory cells.

4. The nonvolatile semiconductor memory device according to claim 3 further comprising a transistor connected between the drains of said memory cells and said charge pump.

5. The nonvolatile semiconductor memory device according to claim 4 further comprising an operational amplifier, an output of said operational amplifier being connected to a gate of said transistor, a potential at an interconnection of said first and second resistor being fed back to an input of said operational amplifier.

6. The nonvolatile semiconductor memory device according to claim 1 wherein a substrate voltage is set to 0V during data programming.

7. The nonvolatile semiconductor memory device according to claim 1 further comprising a drain voltage detection circuit connected to the drains of said memory cells.

8. The nonvolatile semiconductor memory device according to claim 1 wherein said first diode and said second diode are parasitic diodes.

9. The nonvolatile semiconductor memory device according to claim 1 wherein said first diode and said second diode are Zener diodes.

10. The nonvolatile semiconductor memory device according to claim 1 wherein said first diode and said second diode are devices having avalanche breakdown voltages.

11. The nonvolatile semiconductor memory device according to claim 1 wherein said nonvolatile semiconductor memory device is a NOR type flash memory.

12. A nonvolatile semiconductor memory device comprising:
   a plurality of memory cells arranged in matrix and each having a floating gate;
   at least one first transistor connected between drains of said plurality of memory cells and a ground terminal, a source and a gate thereof being connected together; and
   at least one second transistor connected between sources of said plurality of memory cells and said ground terminal, a source and a gate thereof being connected together, wherein said first transistor and said second transistor have a same temperature characteristic.

13. The nonvolatile semiconductor memory device according to claim 12 further comprising a first resistor and a second resistor connected in series between said first transistor and said ground terminal.

14. The nonvolatile semiconductor memory device according to claim 13 further comprising a charge pump connected to the drains of said memory cells.

15. The nonvolatile semiconductor memory device according to claim 14 further comprising a third transistor connected between the drains of said memory cells and said charge pump.

16. The nonvolatile semiconductor memory device according to claim 15 further comprising an operational amplifier, an output of said operational amplifier being connected to a gate of said third transistor, a potential at an interconnection of said first and second resistor being fed back to an input of said operational amplifier.

17. The nonvolatile semiconductor memory device according to claim 12 wherein a substrate voltage is set to 0V during data programming.

18. The nonvolatile semiconductor memory device according to claim 12 further comprising a drain voltage detection circuit connected to the drains of said memory cells.

19. The nonvolatile semiconductor memory device according to claim 12 wherein said nonvolatile semiconductor memory device is a NOR type flash memory.

20. A nonvolatile semiconductor memory device comprising:
- a plurality of memory cells arranged in matrix and each having a floating gate;
- a first circuit for providing a stable voltage to drains of memory cells and a first transistor connected between the drains of said plurality of memory cells and a ground terminal; and
- a second transistor connected between sources of said plurality of memory cells and said ground terminal,
- wherein said first transistor and said second transistor have a same temperature characteristic.

* * * * *